(12) United States Patent
Chen et al.

(10) Patent No.: US 12,114,573 B2
(45) Date of Patent: Oct. 8, 2024

(54) THERMOELECTRIC POLYMER FILM, MANUFACTURING METHOD THEREOF, POWER SUPPLY DEVICE AND TEMPERATURE CONTROL DEVICE

(71) Applicant: National Cheng Kung University, Tainan (TW)

(72) Inventors: Chia-Yun Chen, Tainan (TW); Kuan-Yi Kuo, Kaohsiung (TW); Po-Hsuan Hsiao, Tainan (TW); Yi-Yin Lin, Chiayi (TW)

(73) Assignee: National Cheng Kung University, Tainan (TW)

( * ) Notice: Subject to any disclaimer, the term of this patent is extended or adjusted under 35 U.S.C. 154(b) by 107 days.

(21) Appl. No.: 17/685,402

(22) Filed: Mar. 3, 2022

(65) Prior Publication Data

US 2023/0270008 A1   Aug. 24, 2023

(30) Foreign Application Priority Data

Jan. 25, 2022   (TW) .................................. 111103049

(51) Int. Cl.
| | |
|---|---|
| *H10N 10/857* | (2023.01) |
| *C08K 9/02* | (2006.01) |
| *C09D 165/00* | (2006.01) |
| *H10N 10/01* | (2023.01) |
| *H10N 10/17* | (2023.01) |

(52) U.S. Cl.
CPC ............ *H10N 10/857* (2023.02); *C08K 9/02* (2013.01); *C09D 165/00* (2013.01); *H10N 10/01* (2023.02); *H10N 10/17* (2023.02); *C08K 2201/011* (2013.01)

(58) Field of Classification Search
CPC .... H01N 10/00; H01L 35/26; B05D 2401/32; H10N 10/857; H10N 10/855; H10N 10/00
USPC ......................................................... 427/458
See application file for complete search history.

(56) References Cited

U.S. PATENT DOCUMENTS

2014/0338715 A1* 11/2014 Grunlan ............... H10N 10/855
                                                                977/948
2019/0305310 A1* 10/2019 Wang .................... H01M 4/485

FOREIGN PATENT DOCUMENTS

| CN | 102593342 | * 7/2012 |
| CN | 104335372 | * 2/2015 |
| CN | 112978717 | * 6/2021 |
| KR | 20110048821 | * 12/2011 |

(Continued)

OTHER PUBLICATIONS

A. S. Alshammari et al, Phys. Status Solid RPL 8, 2, (2014) 150-153. (Year: 2014).*

(Continued)

*Primary Examiner* — Tabassom Tadayyon Eslami
(74) *Attorney, Agent, or Firm* — Winston Hsu (57) ABSTRACT

A method for manufacturing a thermoelectric polymer film includes steps as follows. A conductive polymer liquid and a plurality of carbon nanotubes are mixed to form a mixture. The mixture is coated on a substrate to form a film precursor. Two electrode parts are arranged on the film precursor. An electric field is applied to the film precursor through the two electrode parts at a room temperature, so as to change an arrangement of the plurality of carbon nanotubes, such that the thermoelectric polymer film is formed.

14 Claims, 8 Drawing Sheets

(56) References Cited

FOREIGN PATENT DOCUMENTS

KR  10-2017-0126304    11/2017
WO    2016/032594  *  3/2016

OTHER PUBLICATIONS

Chen et al , Thesis Abstract (2019), (Year: 2019).*
M. Amani et al, Electric Field Induced Alignment of Carbon Nanotubes: Methodology and Outcomes; Carbon Nanotubes—Recent Progress; Reviewed: Jul. 27, 2017 Published: Dec. 20, 2017 (Year: 2017).*
Monograph, Kai-Yu Chen, National Cheng Kung University Thesis: "The Study of Thermoelectric Thin Film with High Power Factor Based on Purified CNTs/Conductive Polymer Blends", abstract, 2019.
Monograph, Lu-Chien Shien, National Tsing Hua University Thesis: "The Conducting Polymer-Carbon Nanotube Composites and Their Applications in Thermoelectrics", abstract, 2007.
Monograph, Yi-Yin Lin, National Cheng Kung University Thesis: "Enhancing Output Power Of Low-Temperature Thermoelectric Thin Films and Devices Based on PEDOT:PSS/Carbon Nanotubes Through an Immersion Post treatment", abstract, 2021.

* cited by examiner

THERMOELECTRIC POLYMER FILM, MANUFACTURING METHOD THEREOF, POWER SUPPLY DEVICE AND TEMPERATURE CONTROL DEVICE

BACKGROUND OF THE INVENTION

1. Field of the Invention

The present disclosure relates to a thermoelectric material, a manufacturing method thereof, and a power supply device and a temperature control device having the same, and more particularly, to a thermoelectric polymer film, a manufacturing method thereof, and a power supply device and temperature control device having the same.

2. Description of the Prior Art

Thermoelectric materials are materials that can interchange electrical energy and heat energy. On one hand, when a temperature difference is applied to the thermoelectric materials, the thermoelectric material can generate electric current so as to achieve the effect of generating electricity by heat. On the other hand, when an electric current is provided to the thermoelectric materials, the thermoelectric materials can absorb heat or release heat so as to achieve the effect of heating or cooling by electricity. Based on the above characteristics of the thermoelectric materials, the thermoelectric materials can be applied to the fields of temperature difference power generation and temperature control, and thus have drawn a lot of attention.

At present, the thermoelectric materials are mainly semiconductor materials. A common semiconductor thermoelectric device includes P-type semiconductors and N-type semiconductors connected in series via copper electrodes and disposed between two insulating ceramic substrates. However, the semiconductor materials such as bismuth telluride have scarce amount and difficult to mine. In addition, the semiconductor thermoelectric device is not flexible, which limits the applications thereof.

SUMMARY OF THE INVENTION

According to one embodiment of the present disclosure, a method for manufacturing a thermoelectric polymer film is provided. The method for manufacturing the thermoelectric polymer film includes steps as follows. A conductive polymer liquid and a plurality of carbon nanotubes are mixed to form a mixture. The mixture is coated on a substrate to form a film precursor. Two electrode parts are arranged on the film precursor. An electric field is applied to the film precursor through the two electrode parts at a room temperature, so as to change an arrangement of the plurality of carbon nanotubes, such that the thermoelectric polymer film is formed.

According to another embodiment of the present disclosure, a thermoelectric polymer film is disclosed. The thermoelectric polymer film is manufactured by the aforementioned method.

According to further another embodiment of the present disclosure, a power supply device is disclosed. The power supply device includes the aforementioned thermoelectric polymer film.

According to yet another embodiment of the present disclosure, a temperature control device is disclosed. The temperature control device includes the aforementioned thermoelectric polymer film.

These and other objectives of the present invention will no doubt become obvious to those of ordinary skill in the art after reading the following detailed description of the preferred embodiment that is illustrated in the various figures and drawings.

DETAILED DESCRIPTION

<Method for Manufacturing Thermoelectric Polymer Film>

Figure 1:
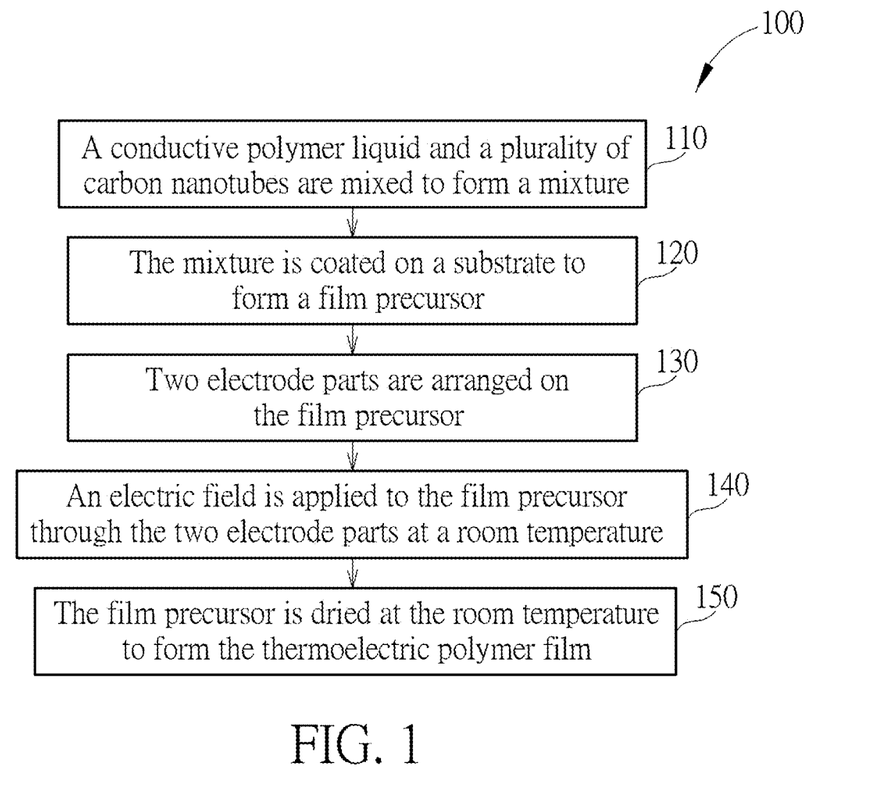
FIG. 1 is a flow diagram showing a method for manufacturing a thermoelectric polymer film according to one embodiment of the present disclosure.

Please refer to FIG. 1, which is a flow diagram showing a method for manufacturing a thermoelectric polymer film according to one embodiment of the present disclosure. The method 100 for manufacturing the thermoelectric polymer film includes Steps 110-140, and can selectively include Step 150. In Step 110, a conductive polymer liquid and a plurality of carbon nanotubes are mixed to form a mixture. The conductive polymer liquid can be a molten conductive polymer or a conductive polymer solution formed by dissolving a conductive polymer with a solvent. The conductive polymer suitable for the present disclosure can be, but is not limited to, polyacetylene, polyaniline (PANI), poly(3-hexylthiophene) (P3HT) or poly(3,4-ethylenedioxythiophene):poly(styrenesulfonate) (PEDOT:PS S). Conductive polymer liquids which can form thermoelectric polymer films having the electrical conductivity greater than or equal to 500 S/cm and the thermal conductivity less than or equal to 5 W/mk are suitable for being the conductive polymer liquids of the present disclosure.

Figure 2:
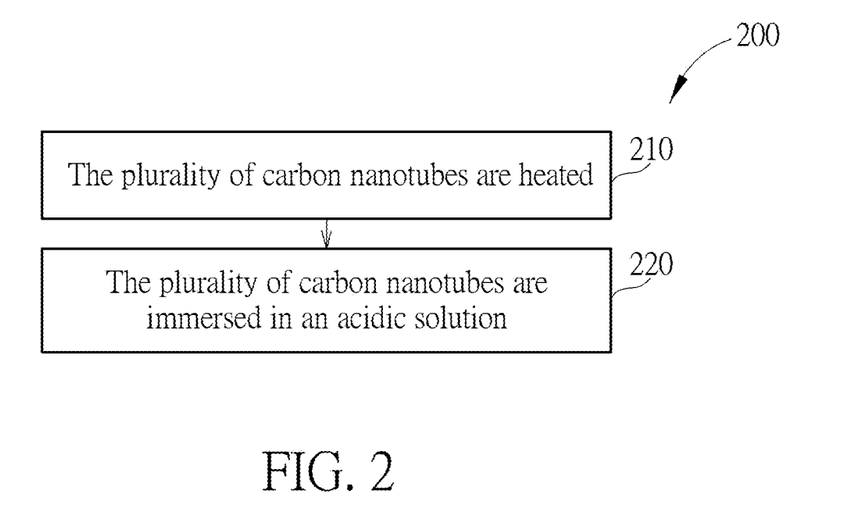
FIG. 2 is a flow diagram showing a method for modifying carbon nanotubes according to one embodiment of the present disclosure.

The plurality of carbon nanotubes can have diameters of 30 nm to 70 nm and lengths of 1 μm to 5 μm. The plurality of carbon nanotubes can be single-walled carbon nanotubes (SWCNTs) or MWCNTs. Each carbon atom of the carbon nanotubes has a pair of P electrons that do not participate in the formation of hybrid orbits and form a conjugated π-π bond. The conjugated π-π bonds are across the entire carbon nanotube, which is beneficial to improve the electrical conductivity. Preferably, the plurality of carbon nanotubes can be modified in advance, such that the activity and the hydrophilicity of the plurality of carbon nanotubes can be improved. Please refer to FIG. 2, which is a flow diagram showing a method for modifying the plurality of carbon nanotubes according to one embodiment of the present disclosure. The method 200 for modifying the plurality of carbon nanotubes includes Step 220, and can selectively include Step 210. In Step 210, the plurality of carbon nanotubes are heated, such that at least a portion of the surfaces of the plurality of carbon nanotubes is oxidized. Thereby, it is beneficial to form modifying groups on the surfaces of the plurality of carbon nanotubes in the subsequent step. Moreover, organic impurities on the surfaces of the plurality of carbon nanotubes can be removed at the same time. Step 210 can be performed at a temperature of 200° C. to 500° C. for 1 hour to 24 hours. According to one embodiment, Step 210 is performed at 450° C. for 1 hour. In Step 220, the plurality of carbon nanotubes are immersed in an acidic solution, such that the surfaces of the plurality of the carbon nanotubes are modified with a plurality of modifying groups, wherein the plurality of modifying groups can be carboxyl groups (—COOH), hydroxyl groups (—OH) or a combination thereof. The acidic solution can be hydrochloric acid aqueous solution ($HCl_{(aq)}$), sulfuric acid aqueous solution ($H_2SO_{4(aq)}$), nitric acid aqueous solution ($HNO_{3(aq)}$) or a combination thereof. A concentration of the acidic solution can be 90 wt % to 100 wt %. Step 220 can be performed at a temperature of 10° C. to 40° C. for 1 hour to 24 hours. Step 220 can be performed with applying ultrasonic waves at the same time. Furthermore, the ultrasonic waves can be applied for the whole process of Step 220 or only part of the process of Step 220. As such, the modification effect can be improved, which is beneficial to allow more modifying groups to attach on the surfaces of the plurality of carbon nanotubes.

Based on 100 parts by weight of the conductive polymer liquid, a content of the plurality of carbon nanotubes can be 0.01 part by weight to 5 parts by weight. The mixture can only include the conductive polymer liquid and the plurality of carbon nanotubes. Alternatively, the mixture can selectively include other additives. The additive can be, but is not limited to, a surfactant and/or a modifier. The surfactant is used to improve the film formation, which is beneficial for the mixture to form a film with uniform thickness when the mixture is coated on the substrate, and the mixture is not easy to spread out to generate pores. The surfactant can be, but is not limited to, TX-100 (Triton X-100). Based on 100 parts by weight of the conductive polymer liquid, a content of the surfactant can be 1 part by weight to 10 parts by weight. The modifier is used to improve the electrical conductivity of the conductive polymer liquid, and can be adjusted according to the type of the conductive polymer liquid. According to one embodiment of the present disclosure, the conductive polymer liquid is a PEDOT:PSS aqueous solution, and a modifier having polarity, such as dimethyl sulfoxide (DMSO), ethylene glycol (EG) or a combination thereof, can be used. The modifier having polarity is beneficial to separate PEDOT and PSS, and thus can improve the electrical conductivity. Based on 100 parts by weight of the conductive polymer liquid, a content of the modifier can be 0.1 part by weight to 3 parts by weight. When the mixture includes the additives, in Step 110, the conductive polymer liquid, the plurality of carbon nanotubes and the additives are mixed to form the mixture. Mixing the conductive polymer liquid and the plurality of carbon nanotubes (and the additives) can be performed at a temperature of 20° C. to 40° C. for 1 hour to 24 hours, so as to mix the aforementioned ingredients evenly to form the mixture.

In Step 120, the mixture is coated on a substrate to form a film precursor. The mixture can be coated on the substrate by spin coating. The substrate is used to carry the film precursor. The substrate can be, but is not limited to, a silicon substrate. The spin coating can be performed at a temperature of 20° C. to 40° C. and a rotating speed of 1000 rpm to 3000 rpm.

In Step 130, two electrode parts are arranged on the film precursor. The two electrode parts are spaced apart from each other. Preferably, the two electrode parts are respectively disposed at two ends of the film precursor. As such, it is beneficial to allow more carbon nanotubes to be affected by the electric field so as to change the arrangement of the plurality carbon nanotubes. The electrode parts are made of electroconductive materials such as copper.

In Step 140, an electric field is applied to the film precursor through the two electrode parts at a room temperature, so as to change the arrangement of the plurality of carbon nanotubes. According to one embodiment of the present disclosure, the two electrode parts are connected with a power source, a voltage of the power source is 5 V to 30 V, and a power-on time is greater than 0 minute and less than or equal to 180 minutes. The power source can be a DC power source or an AC power source. Thereby, the plurality of carbon nanotubes can form an oriented arrangement, and an orientation of the oriented arrangement is substantially parallel to the direction of the electric beneficial to field, which is significantly improve the thermoelectric properties of the thermoelectric polymer film. In Step 150, the film precursor is dried at the room temperature to form the thermoelectric polymer film. If the film precursor has been formed into a film (i.e., the thermoelectric polymer film) during the process of applying the electric field to change the arrangement of the plurality of carbon nanotubes, Step 150 can be omitted. If the film precursor has not been formed into a film after Step 140 is completed, Step 150 is performed to allow the film precursor to air dry naturally at the room temperature to form the thermoelectric polymer film. Furthermore, both Steps 140 and 150 are performed at the room temperature, and the room temperature can be 10° C. to 40° C. Heating is excluded from Steps 140 and 150 to avoid from spoiling the orientated arrangement of the plurality of carbon nanotubes formed by applying the electric field. As such, the thermoelectric properties of the thermoelectric polymer film can be maintained. In addition, after forming the thermoelectric polymer film, the electrode parts can be removed according to subsequent applications. In other words, the two electrode parts are mainly disposed to apply the electric field to the film precursor, and the two electrode parts can be removed once the electric field is no longer needed. That is, the finished thermoelectric polymer film may not include the two electrode parts.

The aforementioned "film precursor" refers to the state that the mixture coated on the substrate is not completely cured to form a film. The process from the mixture being coated on the substrate to the mixture completely cured to form the film can be referred to as film-forming process. According to the above description, in the present disclosure, the arrangement of the plurality of carbon nanotubes is changed by applying the electric field at the room temperature during the film-forming process.

<Thermoelectric Polymer Film>

Figure 3:
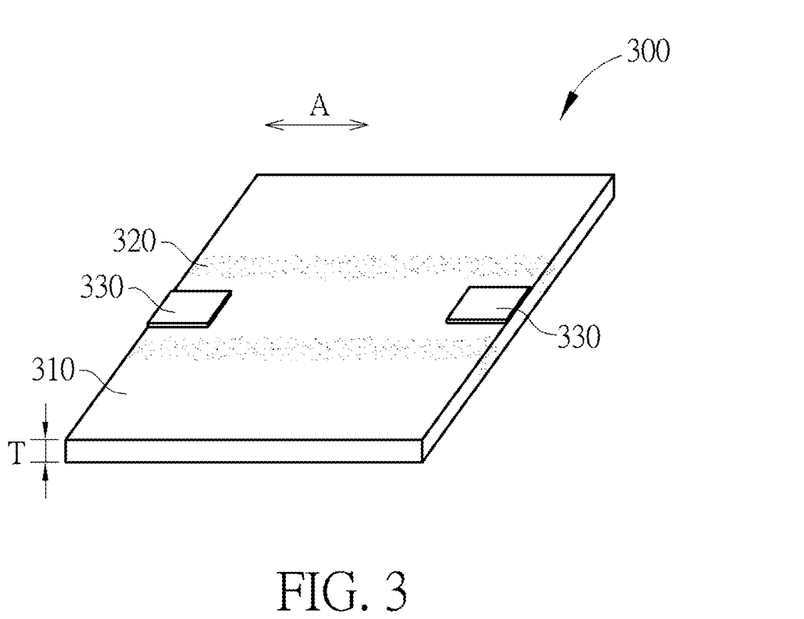
FIG. 3 is a schematic diagram showing a thermoelectric polymer film according to one embodiment of the present disclosure.

Please refer to FIG. 3, which is a schematic diagram showing a thermoelectric polymer film according to one embodiment of the present disclosure. The thermoelectric polymer film 300 includes a polymer matrix 310 and a plurality of carbon nanotubes 320. The plurality of carbon nanotubes 320 are dispersedly distributed in the polymer matrix 310, and the plurality of carbon nanotubes 320 form an oriented arrangement. As shown in FIG. 3, the plurality of carbon nanotubes 320 are aligned along a direction A. A thickness T of the thermoelectric polymer film 300 can be 50 mm to 100 mm. Thereby, the thickness is not too thick to reduce the performance, and the thickness is not too thin to limit the application. The polymer matrix 310 is formed by the conductive polymer liquid. For details of the conductive polymer liquid and the plurality of carbon nanotubes 320, reference can be made to the above description, and will not be repeated herein. The operating temperature of the thermoelectric polymer film 300 of the present disclosure can be 0° C. to 200° C. Thereby, the thermoelectric polymer film 300 has better working efficiency and is not easy to deteriorate. Furthermore, the thermoelectric polymer film 300 can selectively include two electrode parts 330, the electrode parts 330 are for applying the electric field to the film precursor during the film-forming process.

<Application of Thermoelectric Polymer Film>

Figure 4:
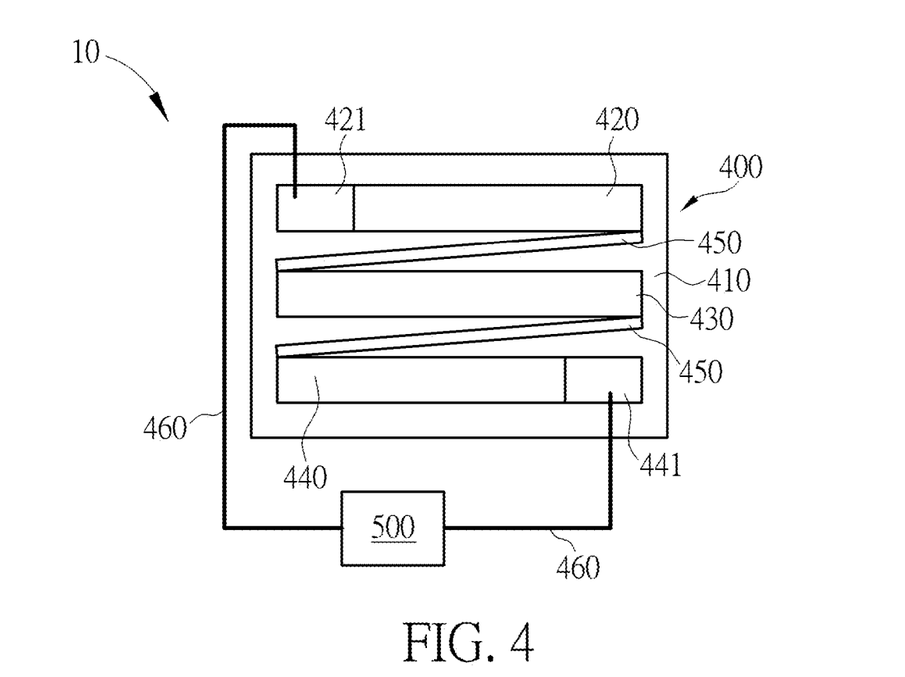
FIG. 4 is a schematic diagram showing a power supply device according to one embodiment of the present disclosure.

Please refer to FIG. 4, which is a schematic diagram showing a power supply device according to one embodiment of the present disclosure. The power supply device 10 includes a thermoelectric unit 400 and a power receiving unit 500. The thermoelectric unit 400 includes a carrier 410, a plurality of thermoelectric polymer films 420, 430 and 440, and a plurality of conductive connecting parts 450. Herein, the number of the plurality of thermoelectric polymer films 420, 430 and 440 is three, and the number of the plurality of conductive connecting parts 450 is two, which are exemplary and can be adjusted according to actual requirements such as the desired voltage generated by the thermoelectric unit 400. The thermoelectric polymer films 420, 430 and 440 are disposed on the carrier 410 and are spaced apart from each other. The thermoelectric polymer film 420 is electrically connected with the thermoelectric polymer film 430 through the conductive connecting part 450, and the thermoelectric polymer film 430 is electrically connected with the thermoelectric polymer film 440 through the conductive connecting part 450, so that the thermoelectric polymer films 420, 430 and 440 are connected in series with each other. The thermoelectric polymer films 420 and 440 are disposed with the electrode parts 421 and 441, respectively. The electrode parts 421 and 441 are electrically connected with the power receiving unit 500 through the wire 460. The conductive connecting parts 450 are made of electroconductive materials, such as copper or silver. According to one embodiment of the present disclosure, the conductive connecting part 450 can be formed by coating the carrier 410 with a silver glue, which is beneficial to simplify the process and reduce the manufacturing cost compared with using copper electrodes to form the series connection in the semiconductor thermoelectric device. The electrode parts 421 and 441 are made of electroconductive materials, such as copper or silver. The power receiving unit 500 can be an electronic device that consumes power, or can be a rechargeable battery. Thereby, a temperature difference can be applied to the thermoelectric unit 400, and the thermoelectric unit 400 can generate current and supply the current to the power receiving unit 500. For example, the thermoelectric unit 400 can be attached to a heat source with the lower surface of the carrier 410. The heat source can exemplary be a chimney of a factory that exhausts waste heat. When the power receiving unit 500 is an electronic device that consumes power, the current generated by the thermoelectric unit 400 can be directly used by the power receiving unit 500. When the power receiving unit 500 is a rechargeable battery, the current can be converted and stored in the form of electrical energy, and the electrical energy can be provided to other electronic devices. Thereby, the heat energy in daily life, such as the ambient heat energy (such as solar energy and heat energy of hot spring and geothermal), waste heat energy (such as industrial waste heat energy and heat energy exhausted by vehicles) and body temperature can be used by the power supply device 10. Accordingly, the dependence on fossil fuels can be reduced, and it is beneficial to reduce the environment burden caused by the waste heat energy. Furthermore, the carrier 410 can be made of a flexible material such as polyethylene terephthalate (PET). Thereby, the thermoelectric unit 400 has flexibility, which is beneficial to broaden the application of the power supply device 10. For example, the thermoelectric unit 400 can be made as a wearable device, and the power receiving unit 500 can be a personal portable device, such as a smart watch and a cell phone. In the case, a temperature difference can be generated by the body temperature, and the electric energy generated by the thermoelectric unit 400 can be provided to the personal portable device. As another example, the power receiving unit 500 can be a heart rhythm regulator or a blood oxygen monitor. As such, the heart rhythm regulator and the blood oxygen monitor do not require periodic battery replacement. As yet another example, the power receiving unit 500 can be a current detection unit. Because the magnitude of current corresponds to the temperature difference, the current detected by the current detection unit can be converted into a temperature, which can be applied to monitor the temperature of the human body.

Figure 5:
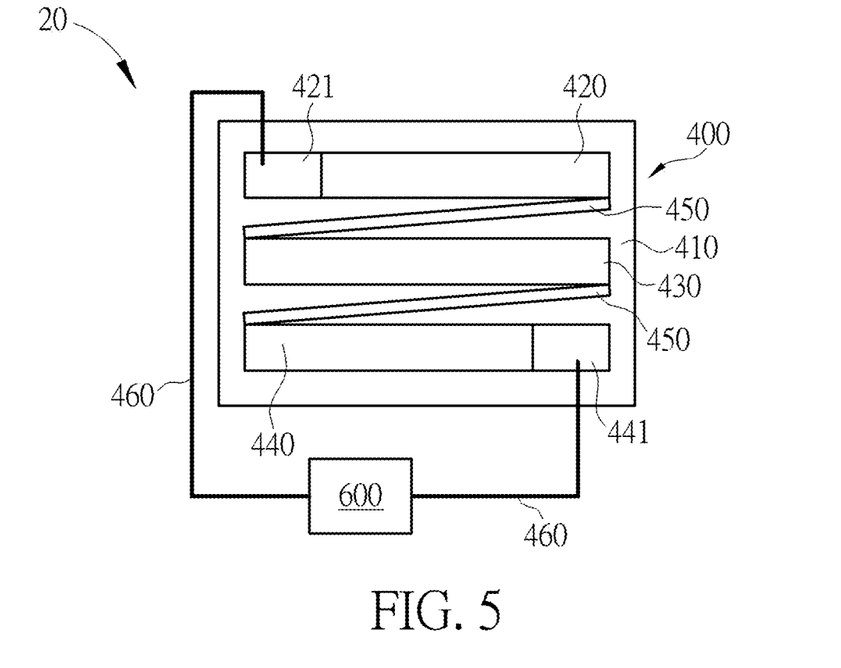
FIG. 5 is a schematic diagram showing a temperature control device according to one embodiment of the present disclosure.

Please refer to FIG. 5, which is a schematic diagram showing a temperature control device according to one embodiment of the present disclosure. The power supply device 10 in FIG. 4 can be converted to a temperature control device 20 in FIG. 5 by replacing the power receiving unit 500 with a power supply unit 600. The power supply unit 600 is a unit that supplies power, such as a battery. Thereby, when the power supply unit 600 provides power, it generates current to pass through the thermoelectric unit 400 to cause the thermoelectric unit 400 to absorb heat or release heat, and thus can be applied to control temperature. For example, the temperature control device 20 can be configured as a cooling (heat-absorbing) device, and the temperature control device 20 can be attached to an object which is desired to be temperature-controlled with the lower surface of the carrier 410. The object can be exemplary an electronic component. As such, the electronic component can be cooled. As another example, the temperature control device 20 can be combined with a piece of clothing, and can be used to control the temperature of the piece of clothing.

Examples and Comparative Examples

Figure 6:
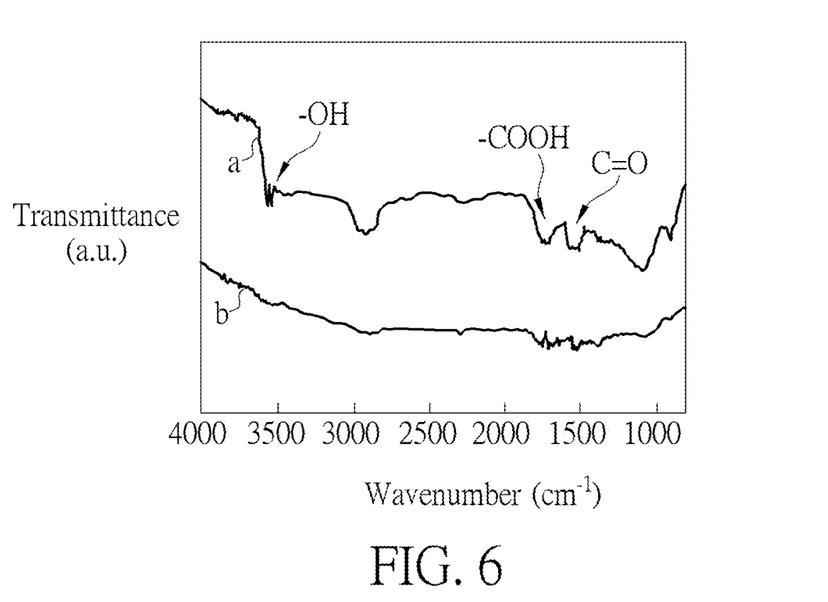
FIG. 6 shows results of Fourier-transform infrared spectroscopy (FTIR) of modified multi-walled carbon nanotubes (MWCNTs) of Example 1 and unmodified MWCNTs.

Example 1:5.4 mg of commercially available MWCNTs are heated at 450° C. for 1 hour (Step 210), then the MWCNTs are placed in a 98 wt % hydrochloric acid aqueous solution and immersed therein at room temperature for 24 hours, in which ultrasonic waves is applied for 2 hours at the same time (Step 220). After filtering, the MWCNTs are washed with deionized water, and are dried to remove moisture. Please refer to FIG. 6, which shows results of FTIR of modified MWCNTs of Example 1 and unmodified MWCNTs. In FIG. 6, the curve a and the curve b are the FTIR results of the modified MWCNTs and the unmodified MWCNTs, respectively. As shown in the curve a, the peak at 1710 $cm^{-1}$ corresponds to the signal of —COOH, the peak at 1650 $cm^{-1}$ corresponds to the signal of C=O, the peak at 3400-3500 $cm^{-1}$ corresponds to the signal of —OH, which shows that after being modified, surfaces of the MWCNTs includes a plurality of modified groups of —COOH and —OH.

Next, a PEDOT:PSS aqueous solution is prepared by dissolving 1.26 g of PEDOT:PSS (trade name is PH1000) with 1.74 g of deionized water. The modified MWCNTs, 0.03 g of DMSO, 0.09 g of TX-100 and PEDOT:PSS aqueous solution are mixed, and are uniformly stirred with a magnetic stirrer at room temperature and a rotating speed of 450 rpm for 24 hours to form a mixture (Step 110).

A substrate is prepared as follows. A P-type silicon substrate is cut to obtained a small piece with an area of 2 cm×2 cm and is immersed in a hydrogen fluoride aqueous solution for 2 minutes to remove silicon dioxide on the surface to obtain a clean silicon substrate. Place the silicon substrate on a spin coater; the mixture is coated on the silicon substrate within 1 minute at 25° C. and with a rotating speed of 1500 rpm to form a film precursor (Step 120). Two copper electrodes are attached to two ends of the film precursor, respectively (Step 130). The copper electrodes are connected to a power supply at room temperature. An alternating current with a voltage of 25 V and a frequency of 60 Hz is provided by the power supply, and the power-on time is 0.5 hour (Step 140). Then the copper electrodes are removed. The film precursor is dried at room temperature for 24 hours (Step 150), so as to form the thermoelectric polymer film of Example 1.

Examples 2-5: the power-on time corresponding to Step 140 in Example 1 is changed to 1 hour, 1.5 hours, 2 hours, and 2.5 hours, respectively, and other steps are the same as that in Example 1, so as to form thermoelectric polymer films of Examples 2 to 5, respectively.

Comparative Example 1: Step 140 in Example 1 is omitted, and other steps are the same as that in Example 1, so as to form a thermoelectric polymer film of Comparative Example 1.

Comparative Example 2: Steps 220 and 140 in Example 1 are omitted, and other steps are the same as that in Example 1, so as to form a thermoelectric polymer film of Comparative Example 2.

Comparative Example 3: Step 140 in Example 1 is omitted, and the time of applying the ultrasonic waves in Step 220 is shortened to 1 hour, and other steps are the same as that in Example 1, so as to form a thermoelectric polymer film of Comparative Example 3.

Figure 7:
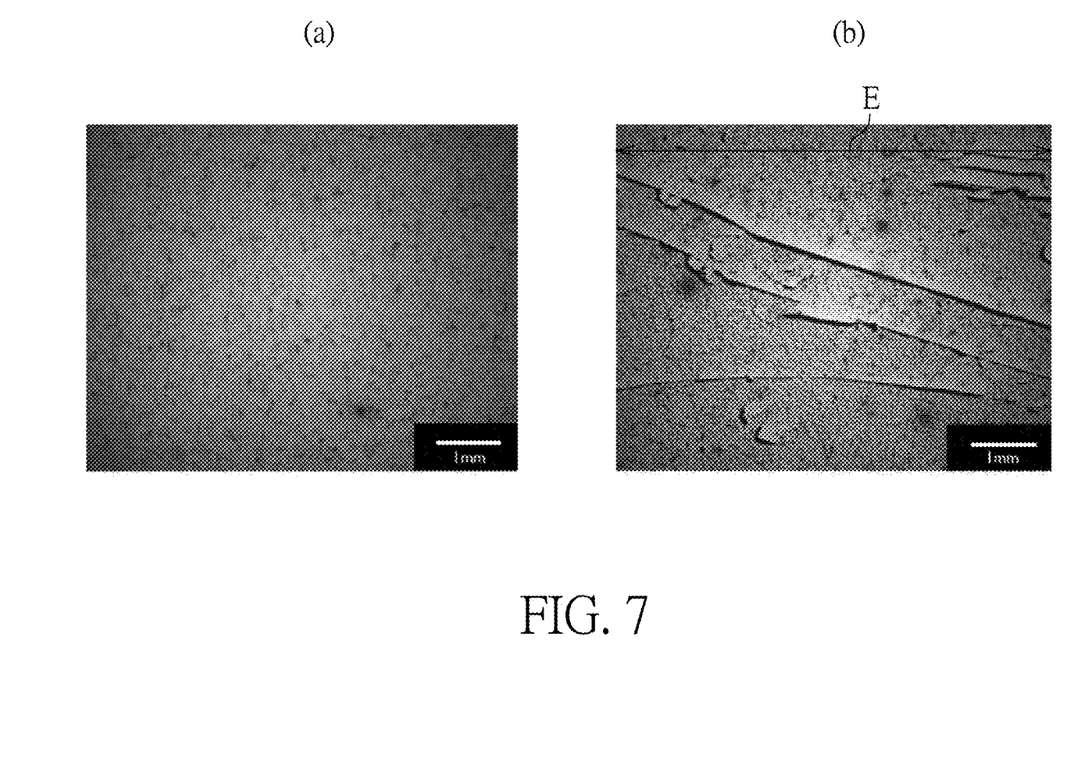
FIG. 7 shows results of optical microscope of the thermoelectric polymer films of Comparative Example 1 and Example 4.
Figure 8:
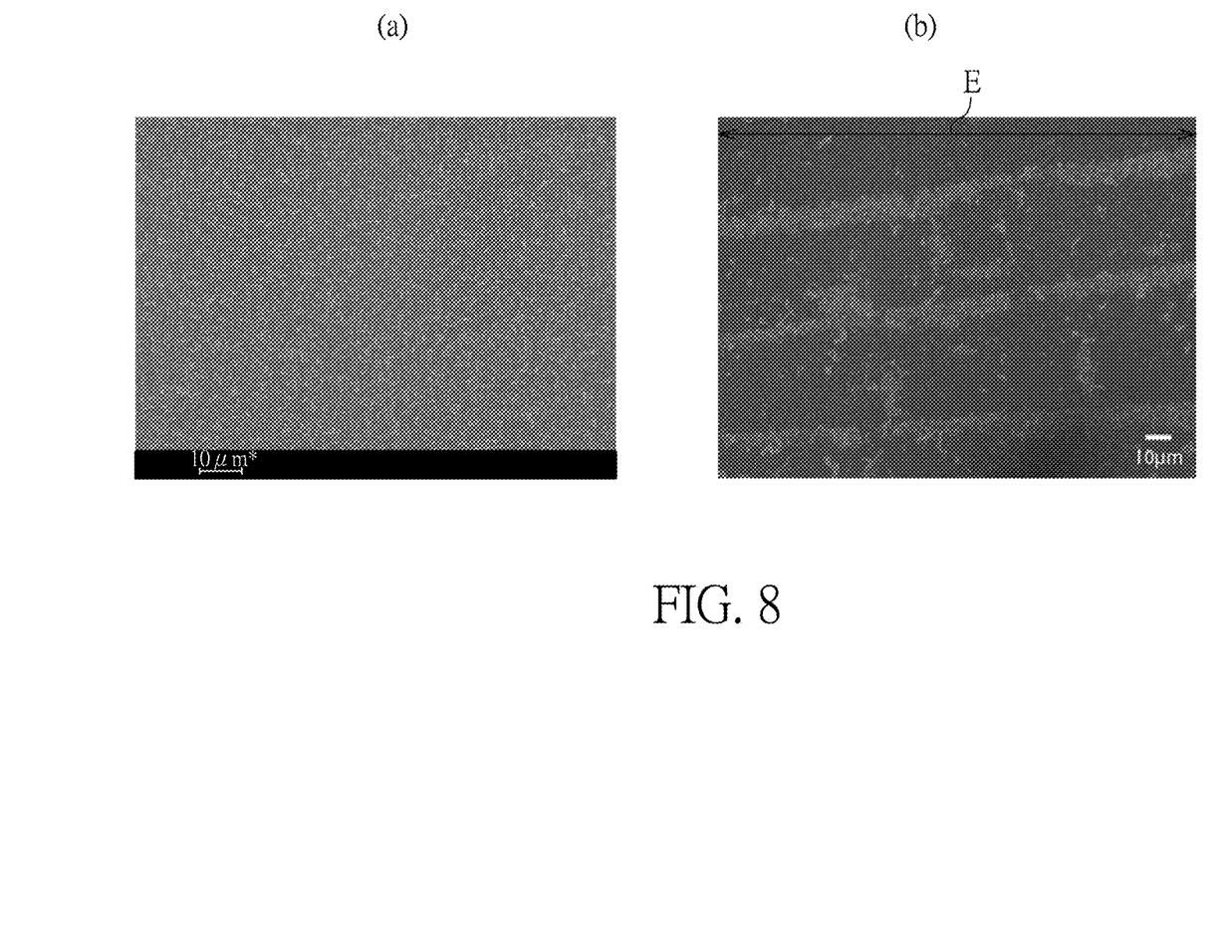
FIG. 8 shows results of scanning electron microscope (SEM) of the thermoelectric polymer films of Comparative Example 1 and Example 4.

Please refer to FIG. 7 and FIG. 8. FIG. 7 shows results of optical microscope of the thermoelectric polymer films of Comparative Example 1 and Example 4. FIG. 8 shows results of SEM of the thermoelectric polymer films of Comparative Example 1 and Example 4. Portions (a) and (b) in FIG. 7 represent the results of Comparative Example 1 and Example 4, respectively. Portions (a) and (b) in FIG. 8 represent the results of Comparative Example 1 and Example 4, respectively. From the portions (a) of FIG. 7 and FIG. 8, it can be seen that in the thermoelectric polymer film of Comparative Example 1, the MWCNTs are randomly distributed. In the portion (b) of FIG. 7, the tubular protrusions are formed by the MWCNTs. From the portions (b) of FIG. 7 and FIG. 8, it can be seen that in the thermoelectric polymer film of Example 4, the MWCNTs form an oriented arrangement, and the orientation of oriented arrangement of the MWCNTs is substantially parallel to the direction E of the electric field, which shows that the arrangement of MWCNTs can be changed by applying the electric field to the film precursor. Further, by applying the electric field, the MWCNTs can be polarized to align substantially parallel to the direction E of the electric field and connected with each other (as shown in the portion (b) of FIG. 7, the MWCNTs are connected with each other to form the tubular protrusions). The connected MWCNTs form carrier channels, which is beneficial to improve the mobility of carriers, and the thermoelectric properties can be improved.

Figure 9:
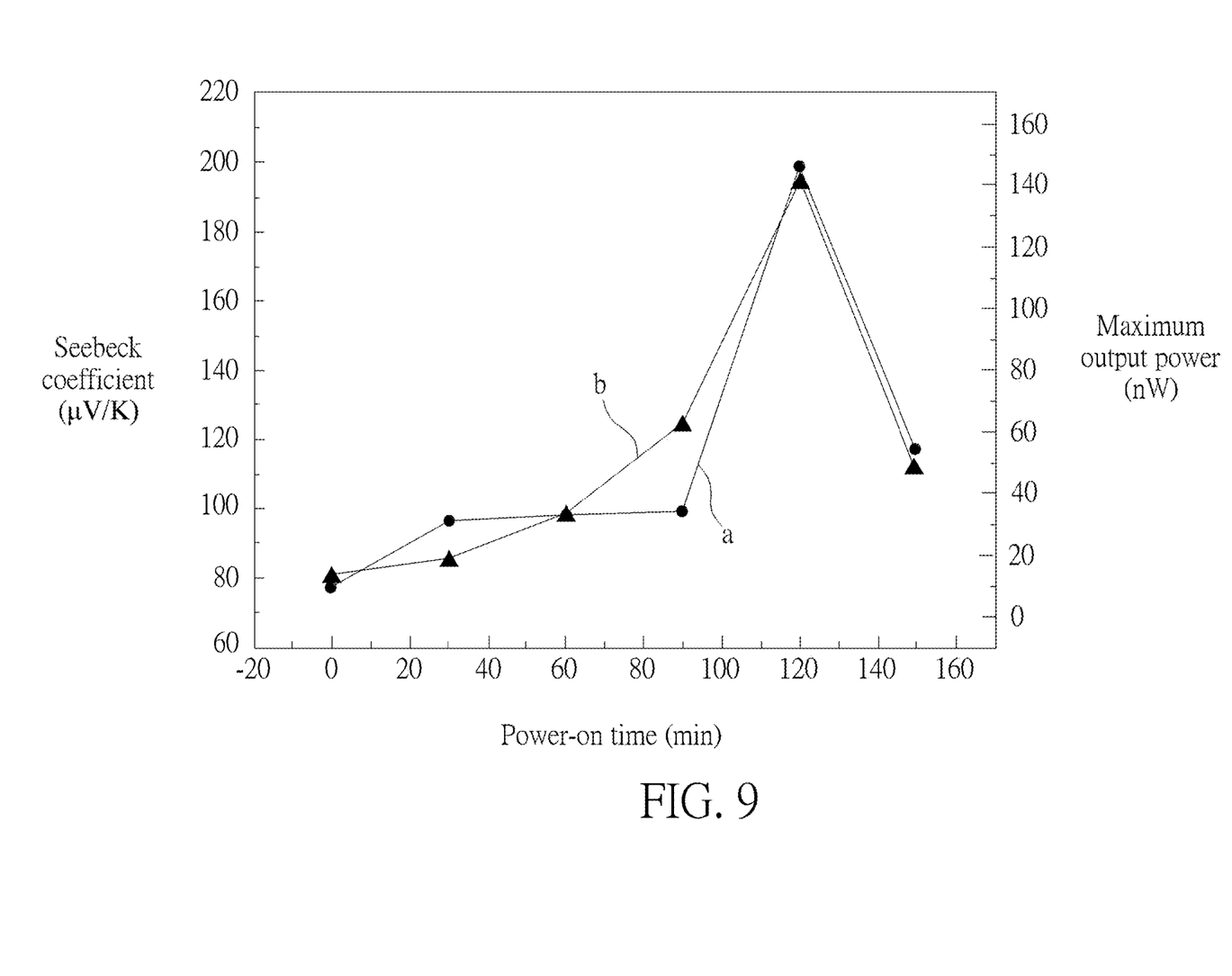
FIG. 9 shows relationships between the Seebeck coefficient/maximum output power and the power-on time of the thermoelectric polymer films of Comparative Example 1 and Examples 1-5.

The thermoelectric polymer films of Comparative Examples 1 to 3 and Examples 1 to 5 are coated with silver glue on both sides with a small brush, respectively. A voltage-current (V-I) curve is obtained by a V-I measurement system (model: Keithley 2400), which controls positive electrode and the negative electrode to perform output voltage sweep and measures the corresponding current via a software, and the maximum output power is calculated according to the V-I curve. Further, the temperature difference is controlled by a Seebeck coefficient measurement system (Model: KLC DTC-1045B-15), and the voltage (also known as thermal voltage) generated by the temperature difference is obtained by the V-I measurement system, so as to calculate the Seebeck coefficient. Please refer to FIG. 9, which shows relationships between the Seebeck coefficient/maximum output power and the power-on time of the thermoelectric polymer films of Comparative Example 1 and Examples 1-5, wherein the curve a shows the relationship between the Seebeck coefficient and the power-on time of the thermoelectric polymer films of Comparative Example 1 and Examples 1-5 from the left side to the right side of the X-axis, and the curve b shows the relationship between the maximum output power and the power-on time of the thermoelectric polymer films of Comparative Example 1 and Examples 1-5 from the left side to the right side of the X-axis. As shown in FIG. 9, each of Examples 1-5 has an improved Seebeck coefficient and maximum output power compared with Comparative Example 1, which shows that the thermoelectric properties of the thermoelectric polymer films can be effectively improved by applying the electric field to the film precursor, and the effect of Example 4 is the most significant. The Seebeck coefficient of Example 4 is 199.1 μV/K, which is much higher than the 78.4 μV/K of Comparative Example 1. The maximum output power of Example 4 (at the temperature of 60K) is 137.9 nW, which is much higher than the 12.8 nW of Comparative Example 1.

Figure 10:
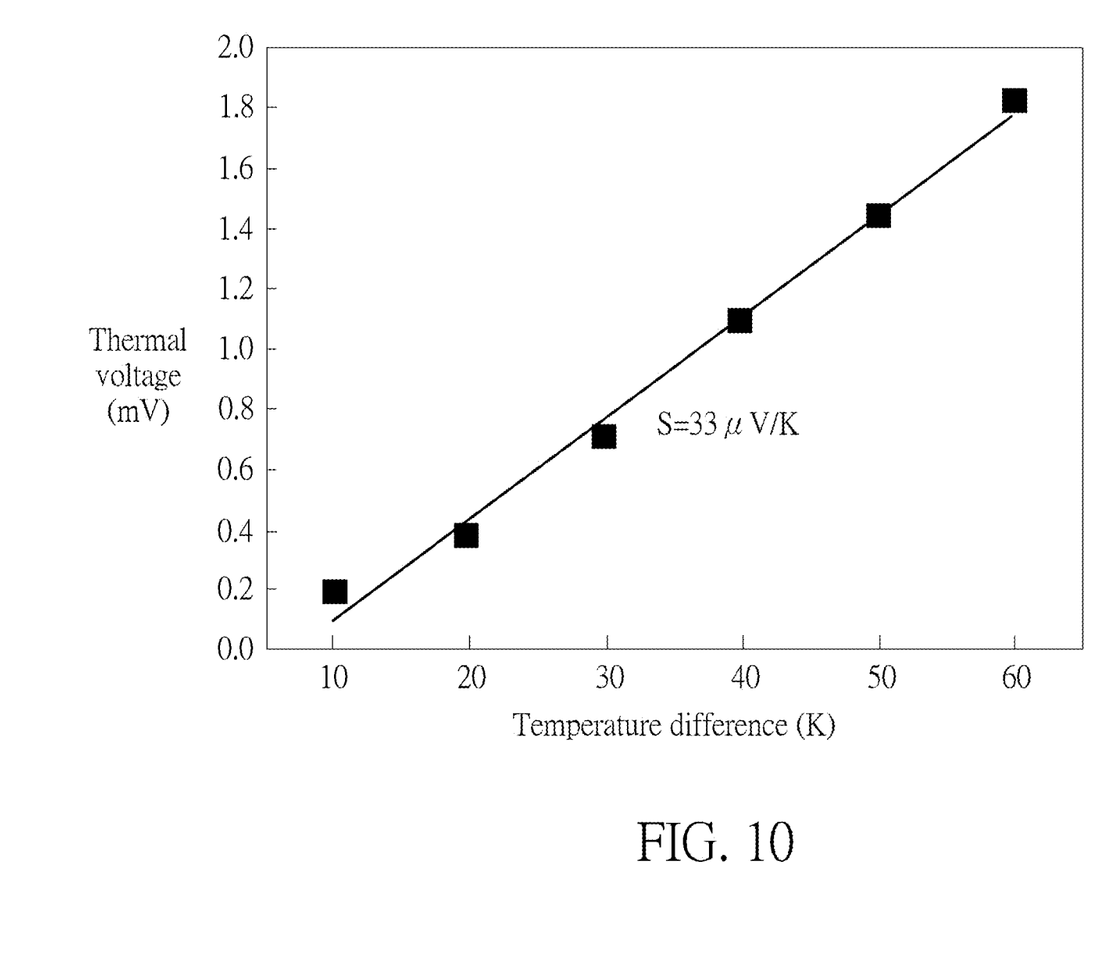
FIG. 10 shows a relationship between the thermal voltage and the temperature difference of Comparative Example 2.

Please refer to FIG. 10, which shows the relationship between the thermal voltage and the temperature difference of the thermoelectric polymer film of Comparative Example 2. According to FIG. 10, the Seebeck coefficient is 33 μV/K. From Comparative Examples 1 and 2, it can be seen that the Seebeck coefficient of the thermoelectric polymer film can be improved by immersing the plurality of carbon nanotubes in the acid solution to form the modifying groups.

Figure 11:
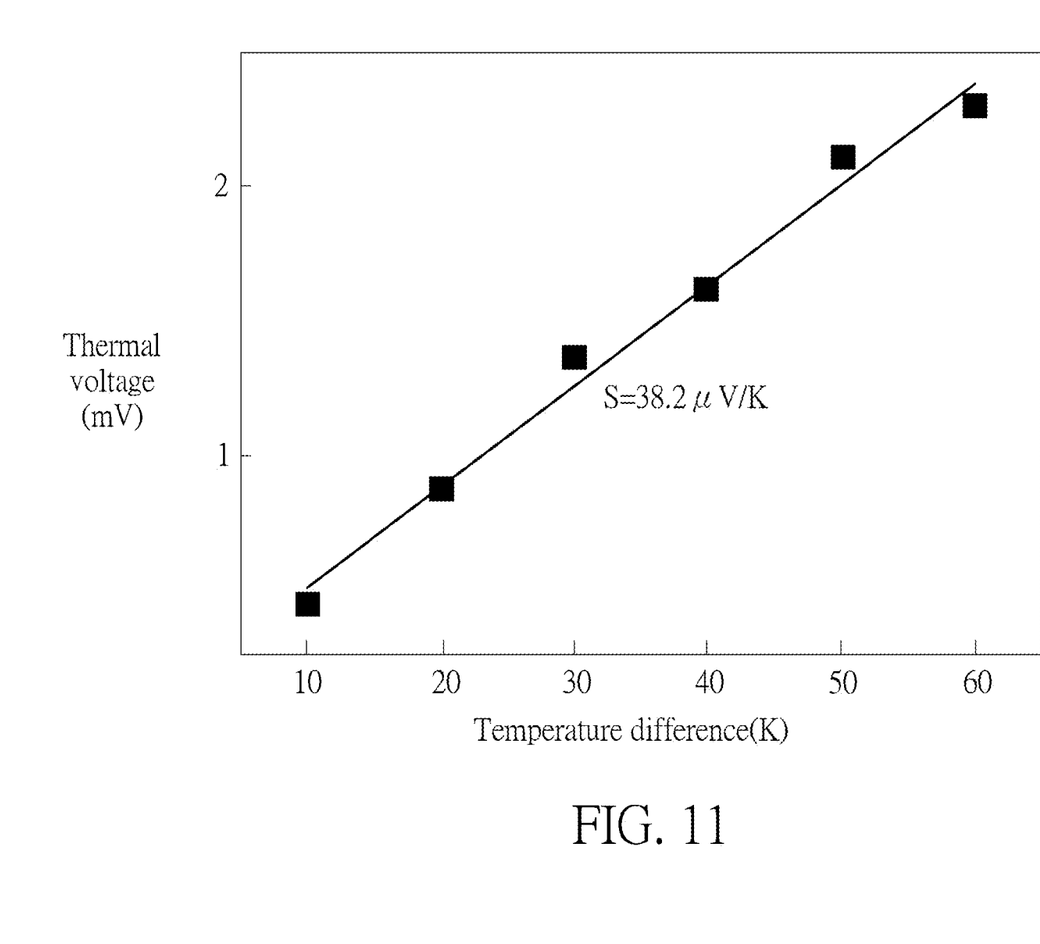
FIG. 11 shows a relationship between the thermal voltage and the temperature difference of Comparative Example 3.

Please refer to FIG. 11, which shows the relationship between the thermal voltage and the temperature difference of Comparative Example 3. According to FIG. 11, the Seebeck coefficient is 38.2 μV/K. From Comparative Examples 1 and 3, it can be seen that when the plurality of carbon nanotubes are immersed in the acidic solution and applied with the ultrasonic waves at the same time, more modified groups can be formed by increasing the time of applying the ultrasonic waves. Accordingly, the Seebeck coefficient of the thermoelectric polymer film can be enhanced.

According to the above description, the thermoelectric polymer film according to the present disclosure uses the conductive polymer as the matrix. The present disclosure has the advantages of easy availability, low production cost, large-area production, light weight and flexibility compared with the semiconductor thermoelectric material. In general, the conductive polymers have poor conductivity. However, in the present disclosure, the electrical conductivity is improved significantly by mixing the plurality of carbon nanotubes in the conductive polymer. Because each carbon atom of the plurality of carbon nanotubes has a pair of P electrons that do not participate in the formation of hybrid orbits and form a conjugated π-π bond. The conjugated π-π bonds are across the entire carbon nanotube to form the conductive channels for the electrons and improve the electrical conductivity. Furthermore, in the present disclosure, the electric field is applied to the film precursor during the film-forming process, which allows the plurality of carbon nanotubes to form an oriented arrangement. Accordingly, it is beneficial to improve the Seebeck coefficient and the maximum output power, and the thermoelectric properties of the thermoelectric polymer film are improved. The thermoelectric polymer film of the present disclosure can be applied to the power supply device and the temperature control device. Since the thermoelectric polymer film of the present disclosure has flexibility, it is beneficial to broaden the application of the power supply device and the temperature control device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a thermoelectric polymer film, comprising:
mixing a conductive polymer liquid and a plurality of carbon nanotubes to form a mixture;
coating the mixture on a substrate to form a film precursor by spin coating;
arranging two electrode parts on a top surface of the film precursor;
applying an alternating current electric field to the film precursor through the two electrode parts at a room temperature, wherein applying the alternating current electric field to the film precursor through the two electrode parts at the room temperature is to connect the two electrode parts with a power source, a voltage of the power source is 5 V to 30 V, and a power-on time is greater than or equal to 0.5 hour and less than or equal to 2.5 hours, so as to change an arrangement of the plurality of carbon nanotubes, such that the plurality of carbon nanotubes form an oriented arrangement; and
drying the film precursor at the room temperature to form the thermoelectric polymer film.

2. The method for manufacturing the thermoelectric polymer film of claim 1, further comprising:
immersing the plurality of carbon nanotubes in an acidic solution prior to form the mixture, such that surfaces of the plurality of carbon nanotubes are modified with a plurality of modifying groups, wherein the plurality of modifying groups are carboxyl groups, hydroxyl groups or a combination thereof.

3. The method for manufacturing the thermoelectric polymer film of claim 2, wherein the acidic solution is hydrochloric acid aqueous solution, sulfuric acid aqueous solution, nitric acid aqueous solution or a combination thereof.

4. The method for manufacturing the thermoelectric polymer film of claim 2, wherein immersing the plurality of carbon nanotubes in the acidic solution is performed at a temperature of 10° C. to 40° C. for 1 hour to 24 hours.

5. The method for manufacturing the thermoelectric polymer film of claim 2, wherein immersing the plurality of carbon nanotubes in the acidic solution is performed with applying ultrasonic waves for at least two hours at the same time.

6. The method for manufacturing the thermoelectric polymer film of claim 2, further comprising:
heating the plurality of carbon nanotubes prior to immerse the plurality of carbon nanotubes in the acidic solution, such that at least a portion of the surfaces of the plurality of carbon nanotubes is oxidized.

7. The method for manufacturing the thermoelectric polymer film of claim 6, wherein heating the plurality of carbon nanotubes is performed at a temperature of 200° C. to 500° C. for 1 hour to 24 hours.

8. The method for manufacturing the thermoelectric polymer film of claim 1, wherein based on 100 parts by weight of the conductive polymer liquid, a content of the plurality of carbon nanotubes is 0.01 part by weight to 5 parts by weight.

9. The method for manufacturing the thermoelectric polymer film of claim 1, wherein mixing the conductive polymer liquid and the plurality of carbon nanotubes is performed at a temperature of 20° C. to 40° C. for 1 hour to 24 hours, so as to form the mixture.

10. The method for manufacturing the thermoelectric polymer film of claim 1, wherein mixing the conductive polymer liquid and the plurality of carbon nanotubes to form the mixture further comprising adding a surfactant.

11. The method for manufacturing the thermoelectric polymer film of claim 10, wherein based on 100 parts by weight of the conductive polymer liquid, a content of the surfactant is 1 part by weight to 10 parts by weight.

12. The method for manufacturing the thermoelectric polymer film of claim 1, wherein the conductive polymer liquid is poly(3,4-ethylenedioxythiophene):poly(styrenesulfonate) aqueous solution.

13. The method for manufacturing the thermoelectric polymer film of claim 12, wherein mixing the conductive polymer liquid and the plurality of carbon nanotubes to form the mixture further comprises adding a modifier, and the modifier has polarity.

14. The method for manufacturing the thermoelectric polymer film of claim 13, wherein the modifier is dimethyl sulfoxide, ethylene glycol or a combination thereof.

* * * * *